(12) United States Patent
Wu et al.

(10) Patent No.: US 11,106,130 B2
(45) Date of Patent: Aug. 31, 2021

(54) DIRECT PATTERNING METHOD FOR A TOUCH PANEL AND TOUCH PANEL THEREOF

(71) Applicant: TPK Touch Solutions Inc., Taipei (TW)

(72) Inventors: Shan-Yu Wu, New Taipei (TW); Chien-Hsien Yu, Hsinchu County (TW); Chih-Min Chen, Taichung (TW); Wei-Na Cao, Fujian (CN); Cheng-Chieh Chang, Taoyuan (TW); Xue-Wei Wei, Fujian (CN); Zhi-Xiong Chen, Fujian (CN)

(73) Assignee: TPK Touch Solutions Inc., Taipei (TW)

( * ) Notice: Subject to any disclaimer, the term of this patent is extended or adjusted under 35 U.S.C. 154(b) by 109 days.

(21) Appl. No.: 16/286,629

(22) Filed: Feb. 27, 2019

(65) Prior Publication Data

US 2019/0271911 A1 Sep. 5, 2019

(30) Foreign Application Priority Data

Mar. 2, 2018 (CN) .......................... 201810175535.0

(51) Int. Cl.
*G06F 3/041* (2006.01)
*G03F 7/00* (2006.01)
(Continued)

(52) U.S. Cl.
CPC .............. *G03F 7/0007* (2013.01); *G03F 7/30* (2013.01); *G06F 3/041* (2013.01); *H05K 3/027* (2013.01);
(Continued)

(58) Field of Classification Search
CPC .......... G03F 7/0007; G03F 7/30; G06F 3/041; G06F 2203/04103; G06F 3/0446;
(Continued)

(56) References Cited

U.S. PATENT DOCUMENTS

2005/0153107 A1* 7/2005 Iijima ............... B32B 17/10174
428/195.1
2010/0089872 A1* 4/2010 Ihara ................. H01L 21/32134
216/83
(Continued)

FOREIGN PATENT DOCUMENTS

JP 2005309097 A 11/2005
JP 2012044093 A 3/2012
(Continued)

OTHER PUBLICATIONS

Notice of Reasons for Refusal and the English Translation as cited in JP Patent Application No. 2019-025435 dated Feb. 26, 2020, 8 pages.

*Primary Examiner* — Lunyi Lao
*Assistant Examiner* — Jarurat Suteerawongsa
(74) *Attorney, Agent, or Firm* — Idea Intellectual Limited; Margaret A. Burke; Sam T. Yip

(57) ABSTRACT

A direct patterning method of touch panel is provided. A substrate having a display region and a peripheral region is provided. A periphery circuit having a bonding pad is disposed on the periphery region. A metal nanowire layer made of metal nanowires are disposed on the display region and the peripheral region. A photosensitive pre-cured layer is disposed on the metal nanowire layer. A photolithography process is performed, which includes exposing the pre-cured layer to define a removal area and a reserved area, and removing the pre-cured layer and the metal nanowire layer on the removal area using a developer solution to form a touch-sensing electrode disposed on the display region and
(Continued)

to expose the bonding pad disposed on the periphery region. The touch sensing electrode made of the pre-cured layer and the metal nanowire layer is electrically connected to the periphery circuit.

18 Claims, 14 Drawing Sheets

(51) Int. Cl.
  *H05K 3/02* (2006.01)
  *H05K 3/06* (2006.01)
  *G03F 7/30* (2006.01)
(52) U.S. Cl.
  CPC ... *H05K 3/064* (2013.01); *G06F 2203/04103* (2013.01); *H05K 2203/0793* (2013.01)
(58) Field of Classification Search
  CPC ..... G06F 3/0443; G06F 3/0412; H05K 3/064; H05K 3/027; H05K 2203/0793; H05K 3/06; H05K 2201/026; H05K 1/097; H05K 1/025; H05K 2203/0769; H05K 2203/0585; H05K 2203/0514
  See application file for complete search history.

(56) References Cited

U.S. PATENT DOCUMENTS

| | | | |
|---|---|---|---|
| 2010/0245269 A1* | 9/2010 | Jeong | H01L 27/323 345/173 |
| 2014/0152910 A1* | 6/2014 | Kang | G06F 3/0445 349/12 |
| 2015/0009422 A1* | 1/2015 | Tung | G06F 3/0446 349/12 |

FOREIGN PATENT DOCUMENTS

| | | |
|---|---|---|
| JP | 2013161704 A | 8/2013 |
| JP | 2013225489 A | 10/2013 |
| JP | 2016146361 A | 8/2016 |
| JP | 2018014329 A | 1/2018 |

\* cited by examiner

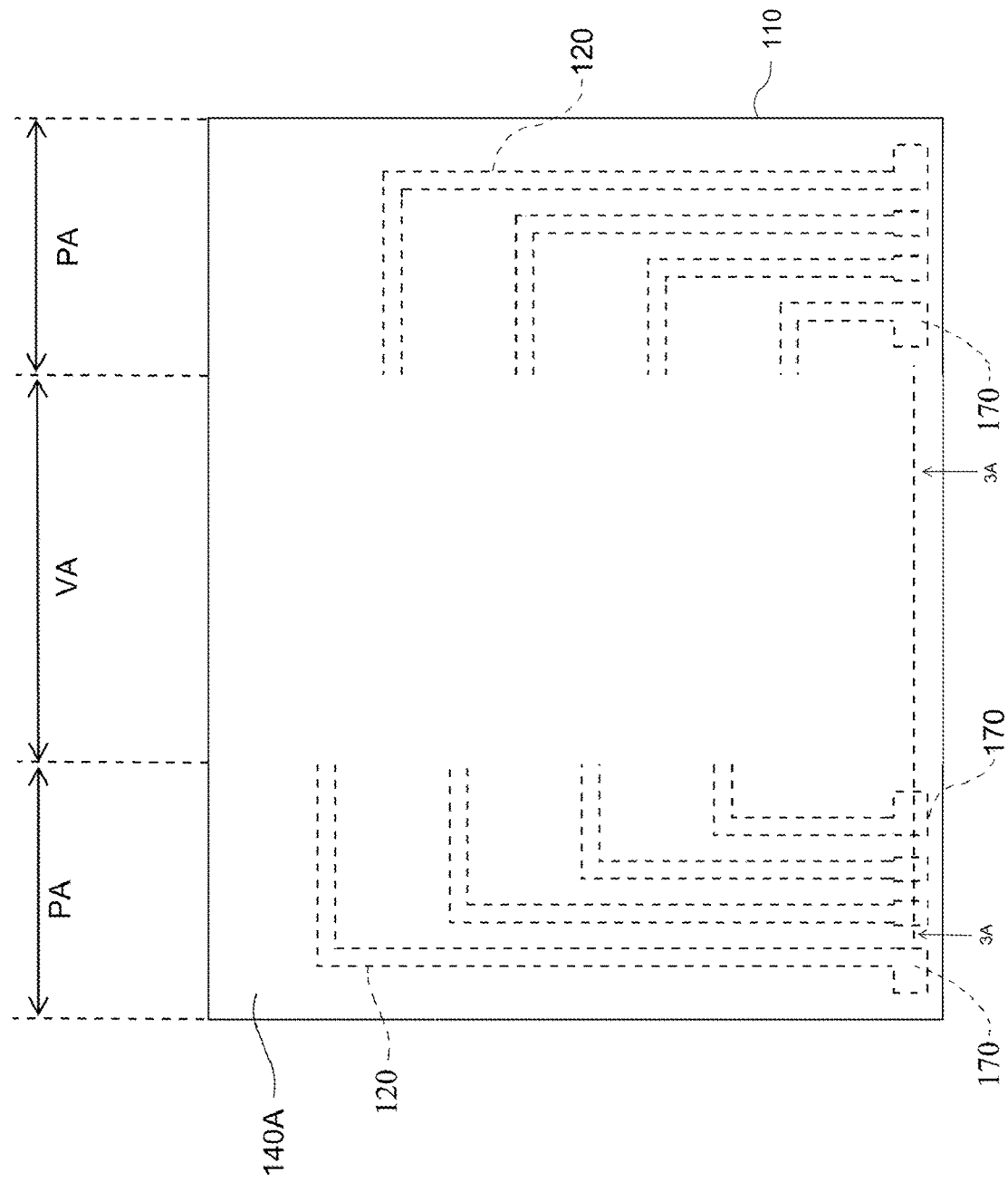

DIRECT PATTERNING METHOD FOR A TOUCH PANEL AND TOUCH PANEL THEREOF

CROSS REFERENCE TO RELATED APPLICATIONS

This application claims priority of Chinese Patent Application No. 201810175535.0 filed on Mar. 2, 2018, the entirety of which is incorporated by reference herein.

BACKGROUND

Technical Field

The disclosure relates to a direct patterning method of touch panel and touch panel thereof.

Description of the Related Art

Transparent conductors, because of their excellent light transmittance and electrical conductivity, are often used in display applications, such as touch-sensing screens. Generally, the transparent conductor may be made of various metal oxides, such as indium tin oxide (ITO), indium zinc oxide (IZO), cadmium tin oxide (CTO), or aluminum-doped zinc oxide (AZO). The metal oxide thin film may be formed by physical vapor deposition (PVD) or chemical vapor deposition (CVD), and patterns in the metal oxide thin film may be formed by a laser ablation process. However, these metal oxide thin films may not meet a flexibility requirement. In some cases, patterned metal oxide thin films may also have visible pattern boundaries, which adversely affects the viewing experience. Transparent conductors based on, e.g. nanowires, are being developed at least partially in response to these problems.

Layers of nanowires can be processed to form flexible touch-sensing electrodes. In conventional processes, the nanowire layer is coated on both the display region and the peripheral region, and metal traces on the peripheral region are covered by the nanowire layer. An etchant solution is then used to pattern the nanowire layer to form a touch-sensing electrode on the display region. In addition, the etchant is also used to etch the nanowire layer on the peripheral region to form electrodes corresponding to the metal leads to construct peripheral circuits, which are electrically connected with an exterior printed circuit board (PCB). An overcoat is usually formed on the nanowire layer to protect the nanowires and to affix the nanowires onto a substrate.

BRIEF SUMMARY OF THE DISCLOSURE

In some embodiments, the durability of the touch-sensing electrodes in the display area may be improved. A low impedance signal-transmission circuit is formed by a direct contact structure between the bonding pads and the electrode pads of the external circuit board. In addition, in some embodiments, a direct patterning method and a touch electrode are shown.

A method for directly patterning a touch panel is provided in some embodiments of the disclosure. The method includes following steps. A substrate having a display region and a peripheral region is provided, and one or more periphery circuit is disposed on the peripheral region. Each periphery circuit has a bonding pad. A metal nanowire layer is disposed on the display region and the peripheral region, and the metal nanowire layer includes nanowires. A pre-cured layer is disposed on the metal nanowire layer, and the pre-cured layer is photosensitive. A photolithography process is performed, which includes exposing the pre-cured layer to define a removal area and a reserved area; and removing the pre-cured layer and the metal nanowire layer on the removal area using a developer solution. Therefore, a touch-sensing electrode disposed on the display region is formed and the bonding pad disposed on the peripheral region is exposed from the pre-cured layer and the metal nanowire layer. The touch-sensing electrode is electrically connected to the periphery circuit. The touch-sensing electrode is made of the pre-cured layer and the metal nanowire layer. In addition, the pre-cured layer is cured to be a cured polymer layer.

In some embodiments of the disclosure, completely removing the metal nanowire layer on the removal area in a second removal step is further included.

In some embodiments of the disclosure, the second removal step includes using an organic solution or an alkaline solution in combination with a mechanical procedure to completely remove the metal nanowire layer on the removal area.

In some embodiments of the disclosure, the second removal step includes utilizing an adhesive removal method to remove the metal nanowire layer on the removal area.

In some embodiments of the disclosure, after disposing the pre-cured layer on the metal nanowire layer, disposing a positive photosensitive layer on the pre-cured layer is further performed. Performing the photolithography process comprises exposing the positive photosensitive layer and the pre-cured layer to define the removal area and the reserved area; and removing the positive photosensitive layer, the pre-cured layer and the metal nanowire layer on the removal area using the developer solution.

In some embodiments of the disclosure, a photosensitivity of the positive photosensitive layer is higher than a photosensitivity of the pre-cured layer. A resolution of the positive photosensitive layer is higher than a resolution of the pre-cured layer, which means that the positive photosensitive layer has a lower smallest linewidth/spacewidth of patterns.

In some embodiments of the disclosure, removing the entire positive photosensitive layer is further included.

In some embodiments of the disclosure, a location of removal area corresponds to a location of the bonding pad. Removing the pre-cured layer and the metal nanowire layer on the removal area comprises removing the pre-cured layer and the metal nanowire layer on the bonding pad.

In some embodiments of the disclosure, removing the pre-cured layer and the metal nanowire layer on the removal area comprises forming a non-conductive region between adjacent touch-sensing electrodes of the touch-sensing electrodes.

In some embodiments of the disclosure, the non-conductive region includes the metal nanowire layer having a concentration lower than a percolation threshold, or the non-conductive region is a gap, e.g., the concentration of the metal nanowires in the non-conductive region is zero.

A touch panel is provided in some embodiments of the disclosure. The touch panel includes a substrate, a polymer layer, a metal nanowire layer, and a periphery circuit. The substrate has a display region and a periphery region. The polymer layer and the metal nanowire layer are disposed on the substrate. The periphery circuit is disposed on the peripheral region. The periphery circuit has a bonding pad. The polymer layer is defined to form a removal area and a reserved area by an exposure process based on the photosensitivity of polymer layer. The touch-sensing electrode on the display region is defined by removing the polymer layer and the metal nanowire layer on the removal area using a developer solution. The bonding pad is exposed from the polymer layer and the metal nanowire layer by removing the layer and the metal nanowire layer on the removal area using a developer solution. The touch-sensing electrode is electrically connected to the peripheral region.

In some embodiments of the disclosure, the metal nanowire layer includes metal nanowires The metal nanowires are embedded in the polymer layer on the reserved area to form a conductive network. The polymer layer and the metal nanowire layer on the display region integrally form the touch-sensing electrode.

In some embodiments of the disclosure, the polymer layer is positive or negative photosensitive.

In some embodiments of the disclosure, a thickness of the polymer layer is about 200 nm to about 400 nm.

In some embodiments of the disclosure, the metal nanowire layer and the periphery circuit form a connection structure at a boundary between the display region and the peripheral region.

In some embodiments of the disclosure, the touch-sensing electrode extends to the peripheral region and covers the periphery circuit, but does not cover the bonding pad.

BRIEF DESCRIPTION OF THE DRAWINGS

FIG. 3 is a top view of step S1 in the manufacturing method of FIG. 1.

DETAILED DESCRIPTION OF THE DISCLOSURE

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically depicted in order to simplify the drawings.

As used herein, "around," "about" or "approximately" shall generally mean within percent, preferably within 10 percent, and more preferably within 5 percent of a given value or range. Numerical quantities given herein are approximate, meaning that the term "around," "about" or "approximately" can be inferred if not expressly stated. In addition, "overcoat, also called an OC layer", "polymer of overcoat", "pre-cured layer", "cured polymer layer" used herein all refer to the same or similar elements, where the main difference is the curing stages of the material, and it should be noted that they may be used interchangeably in the following for ease of description.

Figure 1:
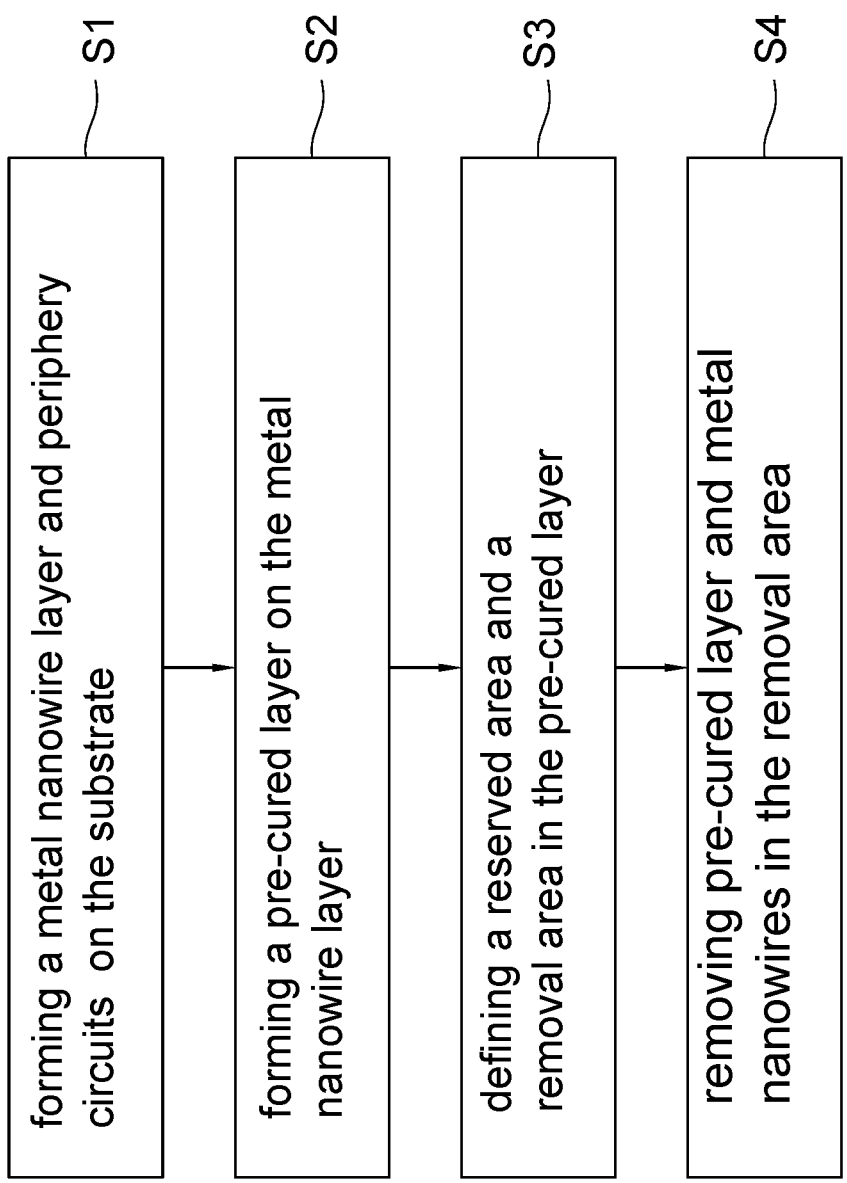
FIG. 1 is a flowchart of a method for manufacturing a touch panel in accordance with some embodiments of the present disclosure.
Figure 2:
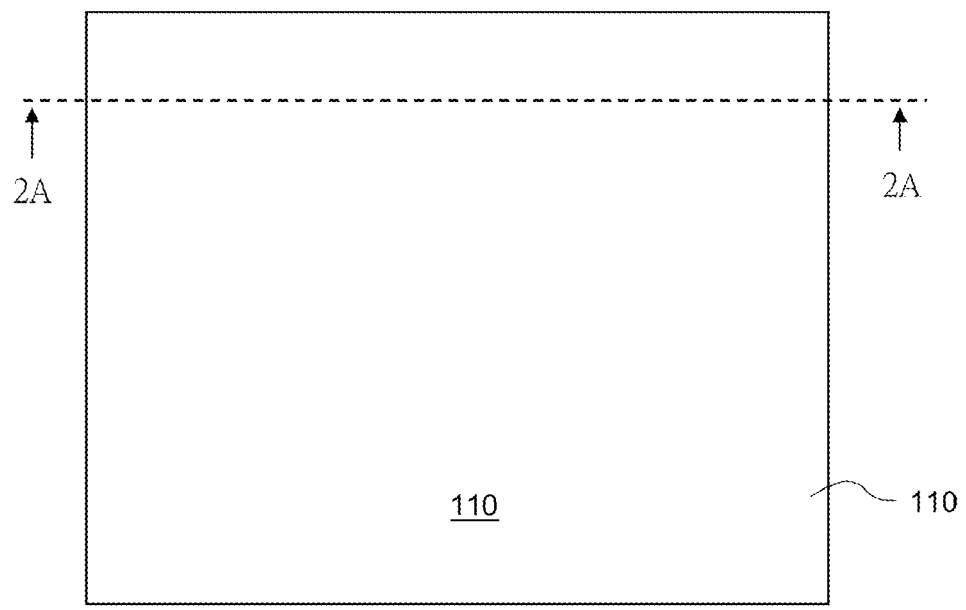
FIG. 2 is a top view of a substrate in accordance with some embodiments of the present disclosure.
Figure 2A:
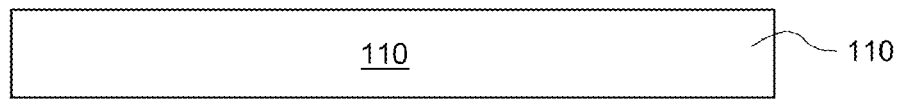
FIG. 2A is a cross-sectional view along line 2A-2A in FIG. 2.

FIG. 1 is a flowchart of a direct patterning method for a touch panel in accordance with some embodiments of the present disclosure. The processes of the direct patterning method of the embodiment include the following steps. First step is, referring to FIG. 2 and FIG. 2A, providing a substrate 110. The substrate 110 is preferably a transparent substrate in some embodiments of the present disclosure. Specific, the substrate 110 may be a rigid transparent substrate or a flexible transparent substrate, and the material of the substrate 110 may be glass, polymethylmethacrylate (PMMA), polyvinyl Chloride (PVC), polypropylene (PP), polyethylene terephthalate (PET), polyethylene naphthalate (PEN), polycarbonate (PC), polystyrene (PS), or another transparent material.

Figure 3A:
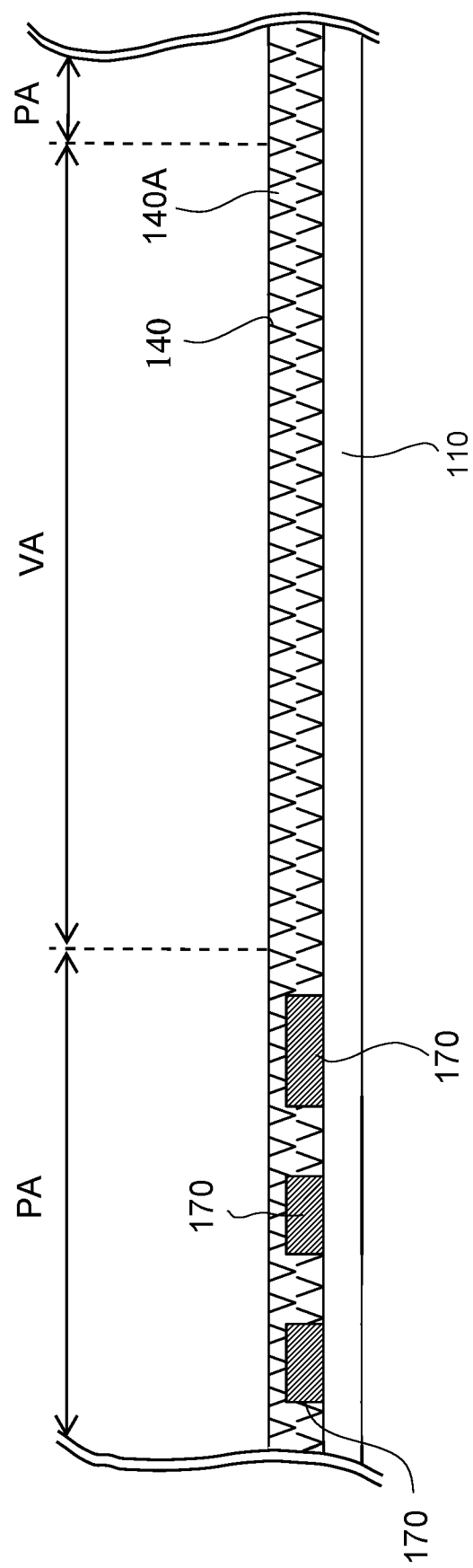
FIG. 3A is a cross-sectional view along line 3A-3A in FIG. 3.

Then, referring to FIG. 3 and FIG. 3A, a metal nanowire layer 140A and periphery circuits 120 are formed on the substrate 110 as in step S1 described in FIG. 1, and the metal nanowire layer 140A at least includes metal nanowires 140. The preferred steps in this embodiment include disposing a metal layer having high electrical conductivity on the defined peripheral region PA of the substrate 110 to form one or more periphery circuits 120, and printing a dispersion or ink having metal nanowires 140 on the substrate 110 by a coating method, followed by drying the dispersion or ink. The metal layer, for example, is a single layer of silver (Ag), copper (Cu), or multilayer materials such as molybdenum/aluminum/molybdenum (Mo/Al/Mo), and one end of each periphery circuit 120 has a bonding pad 170. Patterning processes are preferably conducted with the metal layer for defining patterns of the periphery circuits 120 and for defining the region of the bonding pad 170. Some compositions, such as solvents in dispersion or ink are evaporated to allow metal nanowires 140 adhere to a surface of the substrate 110 to form the metal nanowire layer 140A. In other words, after the above-mentioned drying/curing step, the metal nanowires 140 construct as a metal nanowire layer 140A on the substrate 110.

A display region VA and a peripheral region PA may be defined in advance on the substrate 110. For example, the peripheral region PA is disposed on the sides of the display region VA, as shown in FIG. 3. Specifically, the peripheral region PA is disposed on the left and the right sides of the display region VA. In other embodiments, however, the peripheral region PA may be a frame type area disposed around the display region VA, i.e., peripheral region PA is formed on right side, left side, upper side and lower side of the display region VA. Alternatively, the peripheral region PA may be an L-shape area disposed on the adjacent sides of the display region VA. In addition, the above-mentioned metal nanowire layer 140A may include a first portion formed on the display region VA and a second portion formed on the peripheral region PA. More specifically, the first portion of the metal nanowire layer 140A may be formed directly on the surface of the substrate 110 in the display region VA, and the second portion of the metal nanowire layer 140A may be formed on the surface of the substrate 110 and covers the periphery circuits 120 in the peripheral region PA. it's noted that the second portion of the metal nanowire layer 140A also covers bonding pads 170 of the periphery circuits 120.

In the embodiments of the disclosure, the ink/dispersion containing metal nanowires further comprises solvent such as water, alcohol, ketone, ether, hydrocarbon, or aromatic solvent (benzene, toluene, xylene, etc.). The above ink/dispersion may also includes additives, surfactants, coupling agents, or adhesives such as carboxymethyl cellulose (CMC), 2-hydroxyethyl cellulose (HEC), hydroxypropyl methylcellulose (HPMC), sulfonates, sulfates, disulfonates, sulfosuccinates, phosphate esters, or fluorochemical surfactants, or the like. In some embodiments of the present disclosure, the metal nanowire layer may be a layer of silver nanowires or a layer of copper nanowires. More specifically, "metal nanowires" used herein is a collective noun, which means a collective of metal wires including a plurality of elementary metal, metal alloy or metal compound (which includes metal oxide), and the number of nanowires contained in the metal nanowire layer does not affect the scope of the claim of the present disclosure. Dimension of at least one cross-section (i.e. the diameter of the cross-section) of a single metal nanowire is less than 500 nm, preferably less than 100 nm, and more preferably less than 50 nm. The metal nanostructures of the present disclosure referred to as "wire" mainly have a high aspect ratio, for example, between 10 and 100,000. More specifically, the aspect ratio (i.e., the ratio of length to the diameter of the cross-section) of the metal nanowires may be more than 10, preferably more than 50, and more preferably more than 100. The metal nanowires may be any metal, including but not limited to silver (Ag), gold (Au), copper (Cu), nickel (Ni) and gold-plated silver. Other terms, such as silk, fiber, tube and the like, which also have the aforementioned dimensions and high aspect ratio, are also included within the scope of the disclosure.

The above-mentioned dispersion or ink having metal nanowires 140 may be formed on the substrate 110 by suitable methods, which may include but are not limited to: a screen-printing process, a slot-die coating process, a spray coating process, or a roll coating process. In one embodiment, a roll-to-roll (RTR) process may be utilized to coat the dispersion or ink having the metal nanowires 140 on the surface of the continuous supplied substrate 110.

In some embodiments of the disclosure, the metal nanowires 140 may be silver nanowires or silver nanofibers, which may have an average diameter of about 20 to 100 nanometers and an average length of about 20 to 100 micrometers. The average diameter of about 20 to 70 nanometers and the average length of about 20 to 70 micrometers may be preferred, and the aspect ratio is about 1000. In some embodiments, the metal nanowires 140 may have a diameter of between 70 nanometers and 80 nanometers, and a length of about 8 micrometers.

Figure 4:
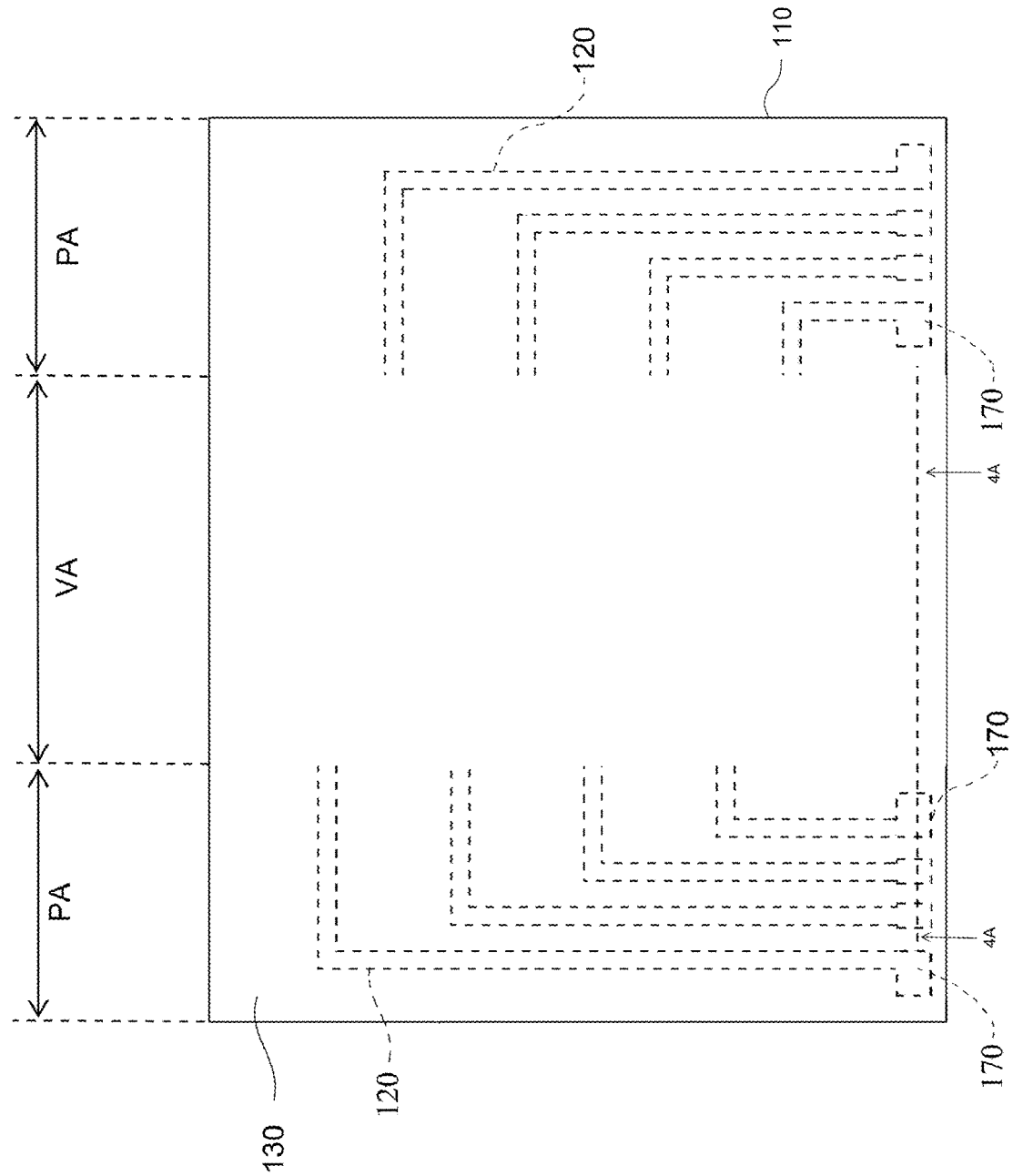
FIG. 4 is a top view of step S2 in the manufacturing method of FIG. 1.
Figure 4A:
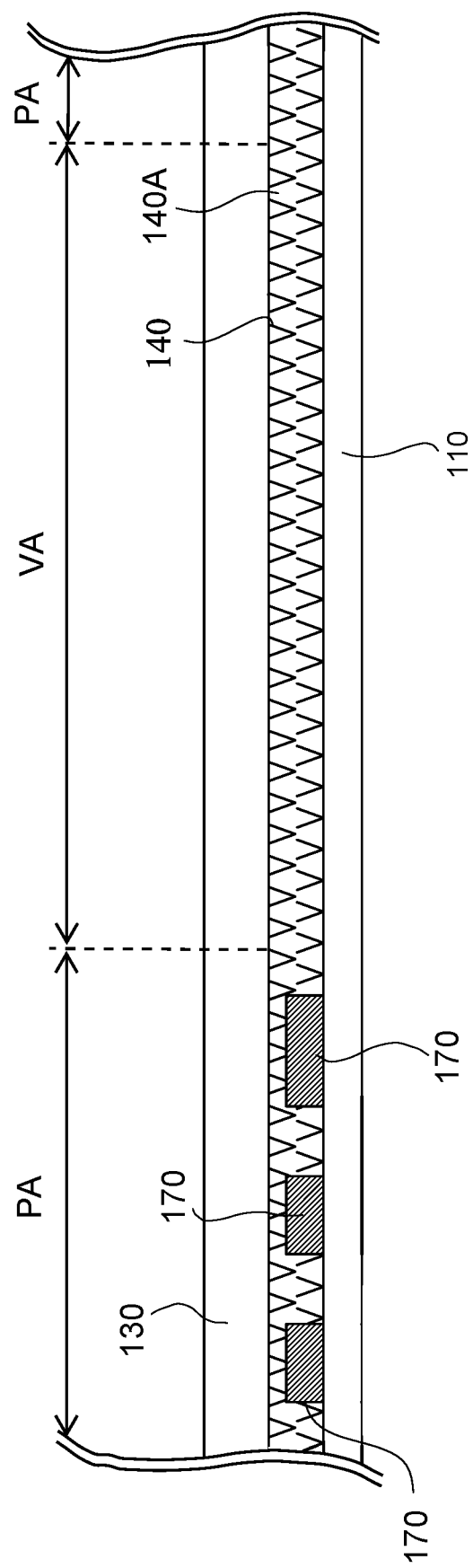
FIG. 4A is a cross-sectional view along line 4A-4A in FIG. 4.

Step S2 is, referring to FIG. 4 and FIG. 4A, forming a pre-cured layer 130 disposed on the metal nanowire layer 140A. The specific method may includes, but not limited to the following steps. The first step is forming a coating layer on the substrate 110 by coating a suitable and pre-curable polymer or the mixture thereof, and then a partial curing step (i.e., a pre-curing step) is applied to the coated layer for forming the pre-cured layer 130 on the metal nanowire layer 140A. In addition, the layer 130 includes a first portion on the display region VA and a second portion on the peripheral region PA. The first portion of the layer 130 may correspond to and be formed on the first portion of the metal nanowire layer 140A, and the second portion of the layer 130 may correspond to and be formed on the second portion of the metal nanowire layer 140A. In an embodiment, a polymer or a mixture thereof is formed on the substrate 110 by a coating method, and the above-mentioned polymer may penetrate into the metal nanowire layer 140A to form a filler or a matrix between the metal nanowires, and the pre-curing step is performed to form the pre-cured layer 130. In other words, the metal nanowires 140 may be embedded in the pre-cured layer 130. In a specific embodiment, the pre-curing step may include heating and/or baking the coated layer to form the pre-cured layer 130 on the metal nanowire layer 140A at about 60° C. to about 150° C. The physical structures of the pre-cured layer 130 and the metal nanowire layer 140A are not limited to the disclosure. For example, the pre-cured layer 130 and the metal nanowire layer 140A may be a stackup of a two-layer structure, or the pre-cured layer 130 and the metal nanowire layer 140A are integrated with each other to form a composite layer. Preferably, the metal nanowires 140 are embedded in the pre-cured layer 130 to form a composite electrode layer (i.e. the composite structure CS to be described later) in the subsequent processes.

The polymer of the pre-cured layer 130 may include non-conductive polymer. Examples of the non-conductive polymers may include, but not limited to, polyacrylate resins, polymethacrylate (for example, poly(methyl methacrylate)), polyacrylate, polyacrylonitrile, poly(vinyl alcohol), polyester (for example, polyethylene terephthalate (PET), poly(ester naphthalate) and polycarbonate), polymers with a high degree of aromaticity such as phenolics or cresol-formaldehyde, polystyrenes, polyvinyltoluene, polyvinylxylene, polyimides, polyamides, polyamideimides, polyetherimides, polysulfides, polysulfones, polyphenylene, polyphenyl ethers, polyurethane (PU), epoxy, polyolefins (e.g. polypropylene, polymethylpentene, or cyclic olefins), cellulosics, silicones and other silicon-containing polymers (e.g. polysilsesquioxanes or polysilanes), polyvinylchloride (PVC), polyacetates, polynorbornenes, synthetic rubbers (e.g., EPR, SBR, EPDM), fluoropolymers (e.g., polyvinylidene fluoride, polytetrafluoroethylene (TFE) or polyhexafluoropropylene), copolymers of fluoro-olefin and hydrocarbon olefin or the like. A photosensitive material may be added to the above-mentioned polymer to meet the requirement of patterning the layer 130 by exposure and developing processes (i.e., the so-called lithograph or photolithography processes). In other embodiments, inorganic materials such as silicon dioxide, mullite, aluminum oxide, SiC, carbon fibers, $MgO$—$Al_2O_3$—$SiO_2$, $Al_2O_3$—$SiO_2$, $MgO$—$Al_2O_3$—$SiO_2$—$Li_2O$ may be mixed into the photosensitive material to form the layer 130.

In addition, the composite structure CS made of the layer 130 and the metal nanowires 140 may have some specific chemical, mechanical, and optical properties after the above-mentioned polymer is fully cured. For example, a preferable adhesive of the composite structure CS to the substrate 110 or a preferable physical mechanical strength is provided. Furthermore, the layer 130 may also be referred as a matrix. In another embodiment, one or more functional polymers are used to fabricate the layer 130 so that the composite structure CS has additional abilities of scratch resistance and/or abrasion resistance. The layer 130 with desired functions protects the devices/structures underneath the composite structure CS from physical damages. Accordingly, the layer 130 may also be referred to as an overcoat (OC layer) or a matrix layer. The polymers of overcoat include, for example, polyacrylate, epoxy, polyurethane (PU), polysilanes, silicones, or poly(silicon-acrylate) may provide composite structure CS with higher surface protection to improve scratch-resistance. Furthermore, cross-linking agent/coupling agent, agglomeration inhibitor, stabilizer (for example, but not limited to, anti-oxidant, UV stabilizers), surfactant or the mixture thereof may be added to the layer 130 or the polymer to improve the properties of the composite structure CS. For example, the anti-ultraviolet ability of the composite structure CS is improved to achieve a longer storage life of products. In other embodiments, the layer 130 may further include corrosion inhibitors. However, the preceding descriptions merely describe the possibilities of additional functions/appellations of the layer 130, and are not intended to be limiting. It should be noted that, since UV stabilizers may be added to the above-mentioned photosensitive polymer, these additives may affect the accuracy of the layer 130 in performing exposure, developing, and similar process. However, in the present disclosure, the effect of the UV stabilizer on exposure accuracy is reduced by adjusting the parameters of the exposure, such as the exposure intensity of UV light.

Next, a lithography step, namely step S3, is performed. The photosensitivity of the layer 130 is provided for performing steps of exposure, developing, or a similar process (generally referred to photolithography processes) on the layer 130 for patterning the layer 130. It may specifically include the following steps: exposing the pre-cured layer 130 to define a reserved area 130A and a removal area 130B; then, step S4, the layer 130 and the metal nanowire layer 140A in the removal area 130B are both removed to form the patterned metal nanowire layer 140A. A developer solution (also called a release agent or a stripping solution) is mainly used to remove the layer 130 and the metal nanowire layer 140A in the removal area 130B to form a touch-sensing electrode TE disposed on the display region VA and also to expose the bonding pad 170 disposed on the peripheral region PA. in other words, the materials on the bonding pad 170 are removed or stripped by the developer solution. More specifically, the developer solution may be used to remove the layer 130 on the removal area 130B, and thus the exposed metal nanowire layer 140A may also be removed by the developer solution. Accordingly, the layer 130 and the metal nanowire layer 140A are patterned to form the touch-sensing electrode TE disposed on the display region VA and to expose the bonding pad 170 disposed on the peripheral region PA. In other embodiments, the step of removing the layer 130 and the metal nanowire layer 140A in the removal area 130B may also be performed by using the developer solution with other solvents. The developing step referred herein is a well-known technology in the art. In short, in the photosensitive materials in the layer 130, the illuminated portion thereof generates chemical reactions, which makes the chemical bonding stronger, and the non-illuminated portion thereof can be removed by the above-mentioned developer solution. Please note the negative photosensitivity is used as an example in the preceding description herein.

Figure 5:
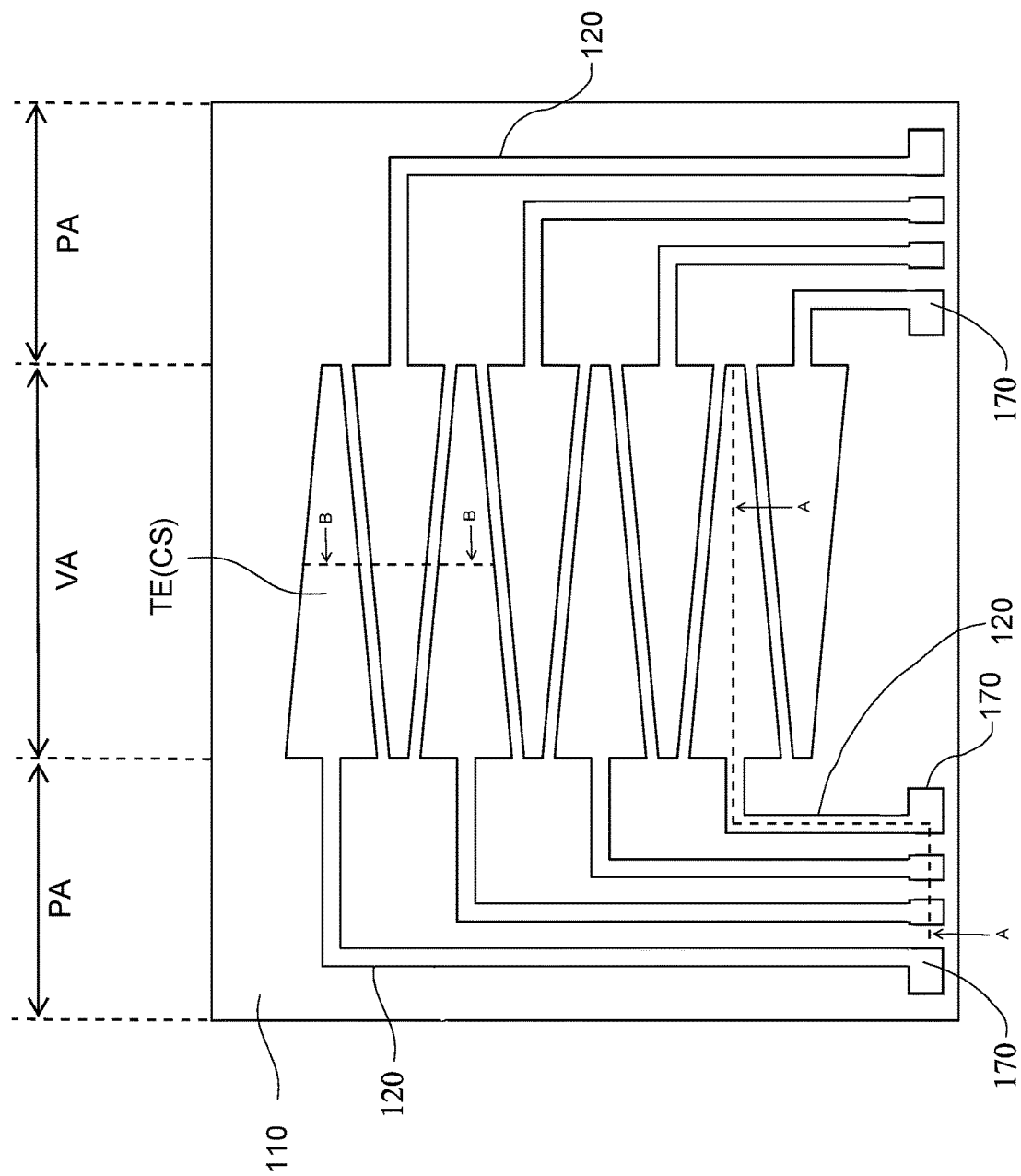
FIG. 5 is the touch panel in some embodiments of the present disclosure.
Figure 5A:
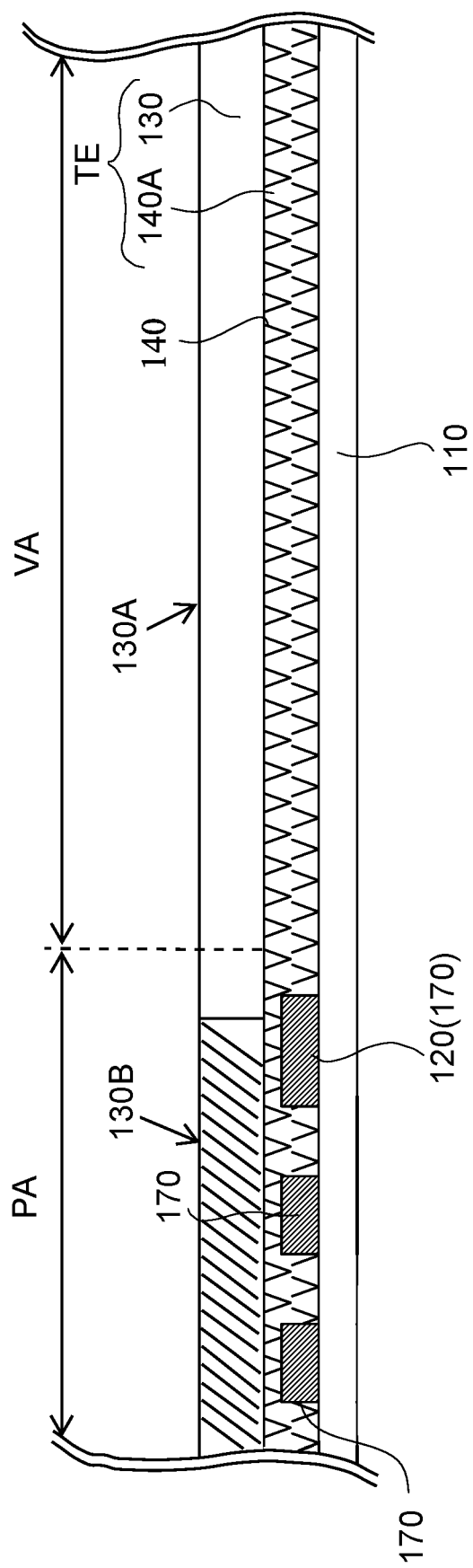
FIG. 5A is a cross-sectional view along line 5A-5A in FIG. 5 in step S3.
Figure 5B:
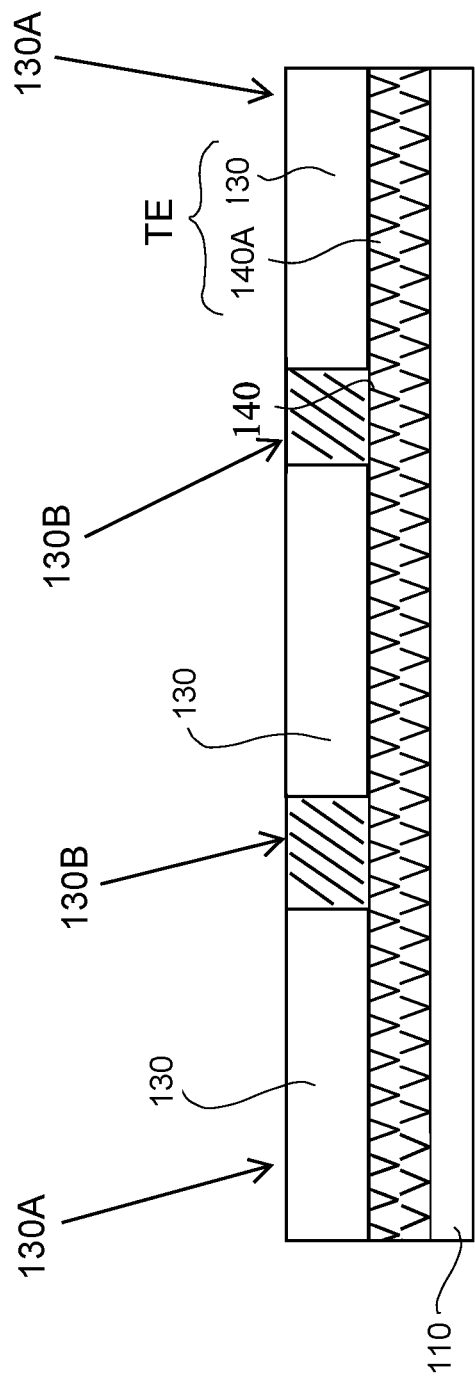
FIG. 5B is a cross-sectional view along line B-B in FIG. 5 in step S3.

Please refer to FIG. 5, which shows a touch panel completed in accordance with some embodiments of the present disclosure. Steps S3 and S4 will be described in detail by referring to cross-sections along lines A-A and B-B in FIG. 5. FIGS. 5A and 5B are cross-sections views along lines A-A and B-B in FIG. 5, respectively, and show the structures of defining the removal area 130B by the exposure step of the layer 130). The structures of the removal area 130B on the display region VA and the peripheral region PA defined by the exposure step are shown in the cross-section A-A, as provided in FIG. 5A. The structures of the removal area 130B on the display region VA defined by the exposure step are shown in the cross-section B-B, as provided in FIG. 5B. As shown in FIGS. 5A and 5B, the layer 130 on the display region VA and the peripheral region PA both have a removal area 130B and a reserved area 130A after exposure step. The layer 130 and the metal nanowire layer 140A on the removal area 130B may be removed at step S4, i.e., the developing step. In the display region VA, the layer 130 and the metal nanowire layer 140A on the reserved area 130A construct the transparent conductive layer in subsequent processes, so as to form the touch-sensing electrode TE.

In a specific embodiment, photomasks are used to cover the layer 130 in step S3. An exposure source (e.g., a UV light source) outputting an energy of about 200 mj/cm$^2$ to about 5000 mj/cm$^2$ is used to transfer the pattern on the photomask to the layer 130, so as to define the above-mentioned removal area 130B and reserved area 130A. In this embodiment, the layer 130 is photosensitive layer, which may be negative photosensitive, but it is not limited thereto, so that the removed area 130B is an unexposed area and the reserved area 130A is an exposed area.

Figure 6A:
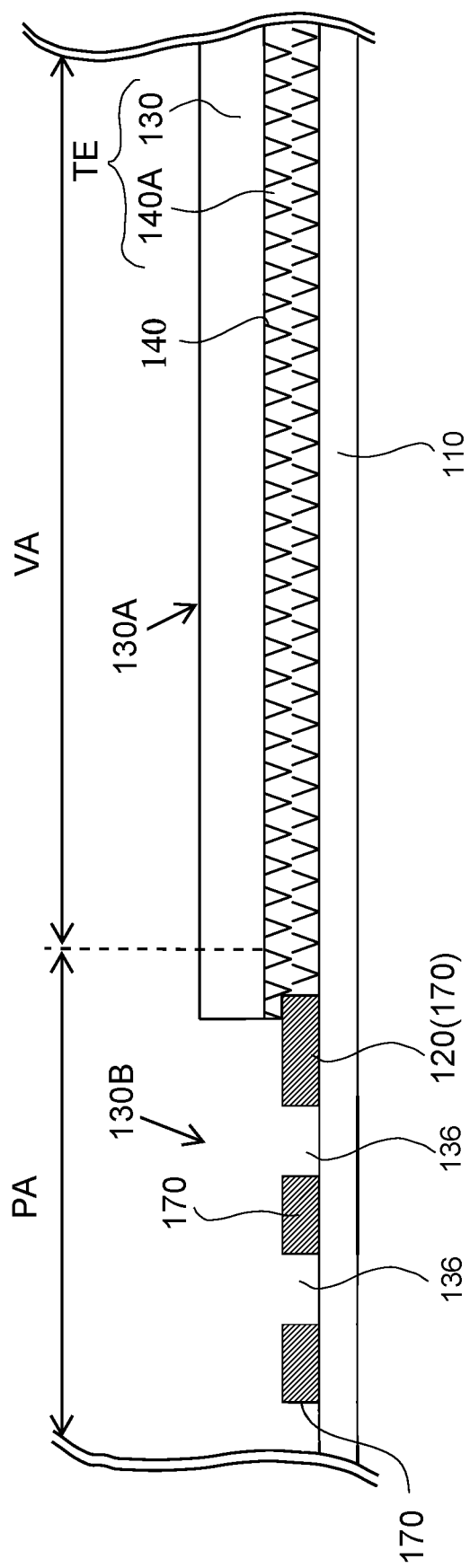
FIG. 6A is a cross-sectional view along line A-A in FIG. 5 in step S4.
Figure 6B:
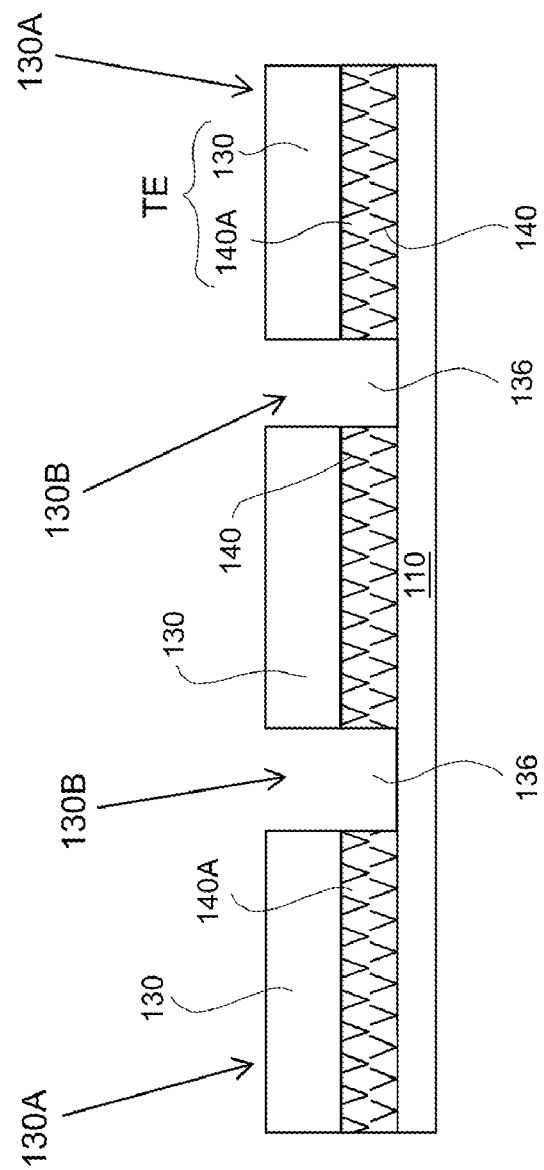
FIG. 6B is a cross-sectional view along line B-B in FIG. 5 in step S4.

Next, an appropriate developer solution is used to remove the above-mentioned layer 130 on the removal area 130B. More specifically, xylene ($C_6H_4(CH_3)_2$), butyl acetate, aromatic hydrocarbon solvents, or the like may be used to remove the above-mentioned layer 130 on the removal area 130B. FIGS. 6A and 6B are cross-sections views along line A-A and B-B in FIG. 5, respectively, after completely removing the exposed metal nanowire layer 140A, and FIGS. 6A and 6B also show the structure of the touch panel manufactured by the embodiment of the present disclosure.

In an embodiment, post-processing steps are included. One of the post-processing steps may be provided to completely remove the remained metal nanowire layer 140A on the removal area 130B. For example, the metal nanowire layer 140A on the removal area 130B may be removed by soaking in a solvent, such as an organic solution (such as IPA, DAA, NMP, or the like) or an alkaline solution (such as tetramethylammonium hydroxide (TMAH), $Na_2CO_3$, or the like). Alternatively, the metal nanowire layer 140A on the removal area 130B may be removed by the soaking in solutions with a mechanical procedure. For example, the above-mentioned solution is sprayed onto the target using a spray head with a controlled pressure, or soaking the devices in the abovementioned solution with ultra-sonic vibration. In another embodiment, an adhesive removal method that employs tape or a similar tool is utilized to remove the metal nanowire layer 140A on the removal area 130B. Since the layer 130 in the removal region 130B has been removed after the described exposure and developing steps, the metal nanowire layer 140A on the removal area 130B may be exposed from the layer 130 so that suitable methods can be performed to remove the metal nanowire layer 140A on the removal area 130B.

In a preferable embodiment, the metal nanowire layer 140A on the removal area 130B may also be stripped by the developer solution as well as the pre-cured layer 130 during the developing step. In other words, one developing step is performed to remove the layer 130 and the metal nanowire layer 140A on the removal area 130B simultaneously, so as to form the touch-sensing electrode TE on the display region VA. In addition, an auxiliary or second removal step such as soaking the devices in a solvent or a adhesive removal step may be performed followed by the aforementioned developing step to completely remove remaining metal nanowires 140 on the removal area 130B. That is, the present disclosure does not limit the timing of the removal of the metal nanowire layer 140A on the removal area 130B. In one preferable embodiment, patterning the metal nanowires 140 can be achieved in the step of stripping the layer 130 without using an etchant solution.

Figure 9:
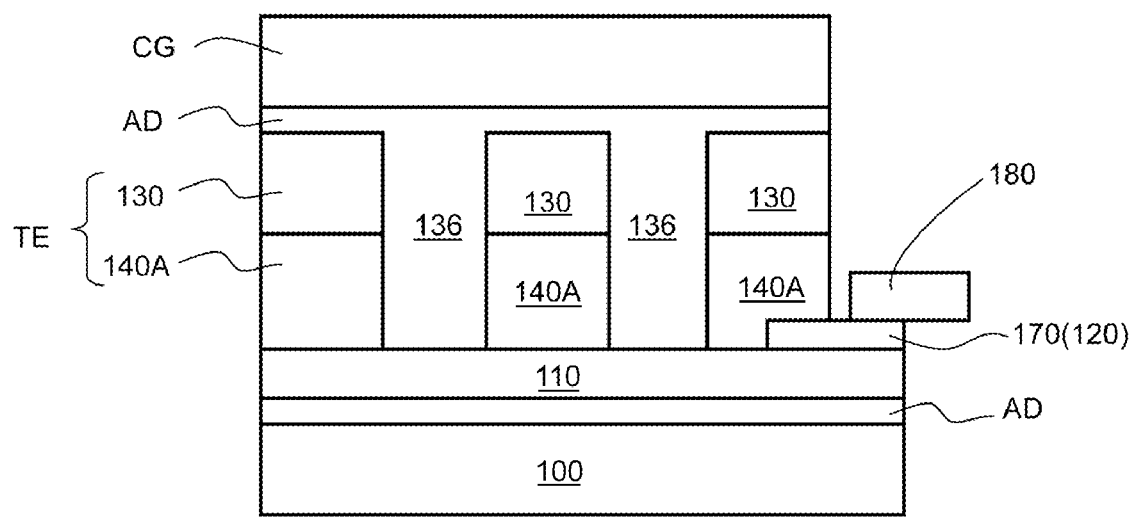
FIG. 9 shows a schematic view of an assembly of a touch panel and other electronic devices of some embodiment of the present disclosure.

In one embodiment, as shown in FIGS. 5A and 6A, the location of the removal area 130B on the peripheral region PA may correspond to the bonding pad 170 of the periphery circuit 120. Preferably, the location of the removal area 130B on the peripheral region PA aligns with the location of the bonding pad 170 of the periphery circuit 120. In other words, after removing the pre-cured layer 130 and the metal nanowires 140, the bonding pad 170 will be exposed and there will be no metal nanowires 140 and layer 130 on the bonding pads 170. Thus, during the bonding step of connecting an external circuit board 180 (e.g., flexible circuit board (FBC)) provided with an external controller with the touch panel, the bonding pad 170 may be directly soldered with the electrode (not shown) of the flexible circuit board to form transmission channels. In another embodiment, soldering auxiliary layers (not shown) may be formed on the bonding pad 170 to improve the soldering strength. Alternatively, conductive paste (not shown, such as anisotropic conductive paste) is provided in the bonding step. Therefore, since the metal nanowires 140 and the layer 130 on the bonding pad 170 are completely removed, the bonding pad 170 and the electrode pad of the circuit board 180 (not shown) may form a directly contacting interface. As a result, a signal-transmitting path with low resistance (as shown in FIG. 9) is achieved to efficiently transmit command signals and touch sensing signals between the touch-sensing electrodes TE and the above-mentioned external controllers. Due to the low resistance, it solves the problem of the high contact resistance/impendence resulted from the indirect connection in conventional structure having a polymer layer between the bonding pad with the electrode pad of the flexible circuit board. In the embodiment, the metal nanowires 140 and the layer 130 on the periphery circuits 120 are completely removed, and the metal nanowires 140 and the layer 130 formed between the adjacent periphery circuits 120 are also completely removed. In other words, the metal nanowires 140 and the layer 130 coated on the peripheral region PA in step S1 are all completely removed, and thus the isolation region (i.e., the non-conductive region 136 described below) may be formed between adjacent periphery circuits 120. The non-conductive region 136 does not have the metal nanowires 140 and layer 130, so the electrical isolation is formed between adjacent periphery circuits 120. Accordingly, the adjacent periphery circuits 120 are electrically insulated from each other and the circuit arrangement of the touch panel is thereby achieved.

In addition, as shown in FIGS. 5, 5B and 6B, the location of the removal area 130B on the peripheral region PA may correspond to the location of the isolation region (i.e., the non-conductive region 136 described below) of the touch-sensing electrode TE, so as to define the touch-sensing electrodes TE for sensing touch positions. Specific, the non-conductive region 136 is formed between adjacent touch-sensing electrodes TE after removing the pre-cured layer 130 and the metal nanowire layer 140A on the removal area 130B In other words, the non-conductive region 136 between adjacent touch-sensing electrodes TE does not include the metal nanowires 140 and layer 130 formed therein. That means the non-conductive region 136 between adjacent touch-sensing electrodes TE is an air space or a gap.

In one embodiment, the above-mentioned process does not completely remove the metal nanowires 140 on the non-conductive region 136. In other words, the metal nanowires 140 remain in the removal area 130B after the step of stripping by the developer solution, and the concentration of the remaining metal nanowires 140 is lower than a percolation threshold. The electric conductivity of the composite structure of the layer 130 and the metal nanowires 140 is controlled at least by the following factors: a) the conductivity of a single metal nano-wire 140, b) the number of metal nanowires 140, and c) the connectivity (also called a contact) between the metal nanowires 140. When the concentration of the remaining metal nanowires 140 is lower than a percolation threshold, the connectivity of the metal nanowires 140 is not enough for generating a continuous electric current path. Thus, the overall conductivity of the material in the removed area 130B is too low to form a conductive network. As a result, the metal nanowires 140 in the removed area 130B form a non-conductive network so as to define the non-conductive region 136. In one embodiment, an area or a structure is considered as being non-conductive in the following exemplary sheet resistance. The sheet resistance is higher than $10^8$ ohm/square, or higher than $10^4$ ohm/square, or higher than 3000 ohm/square, or higher than 1000 ohm/square, or higher than 350 ohm/square, or higher than 100 ohm/square.

Preferably, a curing step may be included after step S4 to cross-link and completely cure the pre-cured layer 130 after patterning to a cured polymer layer. In a specific embodiment, a UV light with intensity of about 100 mj/cm$^2$ to about 1500 mj/cm$^2$ is applied to cure the pre-cured layer 130 or heating pre-cured layer 130 at about 130° C. to about 150° C. within about 10 to 15 minutes) is performed. In other words, the remaining layer 130 may be cured so that the metal nanowires 140 and the cured layer 130 integrally form into a composite structure CS. The metal nanowires 140 may form a conductive network preferably embedded in the layer 130, and thus the composite structure CS form a so-called transparent conductive layer. The transparent conductive layer can be used as a touch-sensing electrode TE in the display region VA after the above-mentioned patterning methods. To achieve a preferred display effect, the transmission (i.e., the transmission in range of visible lights) of the composite structure CS formed by the metal nanowires 140 and layer 130 may be larger than 80%, and surface resistance is between about 10 to 1000 ohm/square. Preferably, the transmission of the composite structure CS may be larger than about 85%, with a surface resistance between about 50 to 500 ohm/square.

So far, a touch panel, which may be used for sensing touches, is fabricated. The touch panel may include the touch-sensing electrode TE (i.e. the composite structure CS formed by the layer 130 and the metal nanowires 140) formed on the display region VA of the substrate 110 and the periphery circuits 120 formed on the peripheral region PA of the substrate 110. The touch-sensing electrode TE and the periphery circuits 120 are electrically connected to each other to transmit signals. In the embodiment, the metal nanowire layer 140A of the touch-sensing electrode TE and the periphery circuits 120 may form a connection structure at the boundary between the display region VA and the peripheral region PA. More specifically, as shown in FIG. 6A, the metal nanowire layer 140A of the touch-sensing electrode TE may slightly protrude from the display region VA and extend to the peripheral region PA so that the end portion of the metal nanowire layer 140A of the touch-sensing electrode TE climbs on the periphery circuits 120. In the embodiment, the peripheral region PA may be substantially divided into two areas. The first area is the reserved area 130A where the composite structure CS is remained in the patterning steps, and the remained composite structure CS forms the end portion of the touch-sensing electrode TE. The end portion extends on the periphery circuits 120 for forming the connection structure of the touch-sensing electrode TE and the periphery circuits 120. The second area is the removal area 130B, and the periphery circuits 120 are mainly located on the removal area 130B. Therefore, in addition to the above-mentioned connection structure, the periphery circuits 120 including the bonding pad 170 do not have a layer 130 and the metal nanowires 140 formed thereon, and the non-conductive regions 136 between the adjacent periphery circuits 120 do not have a layer 130 and metal nanowires 140 as well. In another embodiment, the metal nanowire layer 140A and the layer 130 may extend into the peripheral region PA, so that the metal nanowire layer 140A and the layer 130 cover the periphery circuits 120. However, the bonding pads 170 of the periphery circuits 120 are exposed from the metal nanowire layer 140A and the layer 130. In other words, the peripheral region PA may be substantially divided into two areas. The first area is the reserved area 130A, and the dimension and the location of the reserved area 130A corresponds to the dimensions and the location of the periphery circuits 120, except the bonding pad 170. As a result, the composite structure CS is remained in reserved area 130A after the patterning steps so that the touch-sensing electrodes TE extend to the peripheral region PA to cover the periphery circuits 120, but not the bonding pad 170. On the other hand, the second area is the removal area 130B, which corresponds to bonding pads 170 and the non-conductive regions 136 between the adjacent periphery circuits 120. After the patterning steps, the bonding pads 170 are exposed from the metal nanowire layer 140A and the layer 130, and the non-conductive region 136 is formed between the adjacent periphery circuits 120. Accordingly, the bonding pad 170 of the periphery circuits 120 does not have a layer 130 and metal nanowires 140 on the bonding pad 170. Generally speaking, the layer 130 and the metal nanowires 140 may have a variety of structure models on the peripheral region PA, as long as the bonding pad 170 can be exposed from the layer 130 and the metal nanowires 140. The exposed bonding pad 170 may be directly bonded with the desired electrodes of the external PCB so that the improved contact with the bonding pad 170 and the electrodes of the external PCB is achieved.

Because the bonding pad 170 does not have a layer 130 formed thereon, the problem of contact resistance resulted from the thickness of the layer 130 may be solved. Moreover, the processes (for example, deposition time) for forming the layer 130 can be controlled to increase the thickness of the layer 130, so that the metal nanowires 140 can have a sufficient protection of anti-oxidation, moisture resistance, acid/alkali resistance, and the like by the layer 130 with a desired thickness. In the specific embodiment, the thickness of the layer 130 in the present disclosure may be about 40 nm to about 400 nm, preferably about 200 nm to about 400 nm. The above-mentioned maximum thickness limit (for example, the above-mentioned 400 nm) can also greatly improve the protection ability to the metal nanowires 140. In addition, the range of the thickness of the layer 130 in the present disclosure is wider than that of the conventional layer so that the process window of the present disclosure is not as limited as the conventional processes.

Preferably, the formed metal nanowires 140 may be further treated to increase their electrical conductivity, and the subsequent processing can be a process including, for example, heating, plasma, corona discharge, UV ozone, or pressure. For example, after the curing step for forming the metal nanowire layer 140A, a roller may be used to apply pressure thereto. In one embodiment, 50 to 3400 psi of pressure may be applied to the metal nanowire layer 140A by one or more rollers, and 100 to 1000 psi, 200 to 800 psi, or 300 to 500 psi of pressure may preferably be applied. In some embodiments, the post treatment of heating and pressure may be performed simultaneously. More specifically, the formed metal nanowires 140 may be pressurized by one or more rollers and also heated at the same time. For example, pressure applied by a roller may be in a range from 10 to 500 psi, and preferably from 40 to 100 psi; and the roller is heated to a temperature in a range from about 70° C. to about 200° C. at the same time, preferably in a range from about 100° C. to about 175° C. The post processes are applied to improve at least the conductivity of the metal nanowire layer 140A. In some embodiments, the metal nanowires 140 may preferably be exposed to reducing agents in a process of the post treatment. For example, the metal nanowires 140 made of silver nanowires can preferably be exposed to a silver reducing agent. The silver reducing agent includes borohydride, such as sodium borohydride; boron nitrogen compound, such as DMAB; or gaseous reducing agent, such as (hydrogen) $H_2$. The time period of the exposure is in a range from about 10 seconds to about 30 minutes, and preferably from about 1 minute to about 10 minutes. The above-mentioned step of applying pressure may be performed before or after the step of coating the layer 130, depending on requirements.

As shown in FIG. 5, the touch panel of this embodiment is a sensitive touch panel having single-sided non-cross electrodes, and there may be one or more touch-sensing electrodes TE. In more detail, the display region VA has a plurality of touch-sensing electrodes TE extending in the same direction, which are strip-like electrodes respectively formed by the layer 130 and the metal nanowires 140. The non-conductive region 136 defined by the removed area 130B in the above process is located between adjacent touch-sensing electrodes TE. Similarly, the non-conductive region 136 defined by the removed region 130B is also formed in the peripheral region PA to electrically insulate adjacent peripheral circuits 120. The metal nanowire layer 140A of the touch panel in this disclosure may be patterned directly without using an etchant solution. The metal nanowire layer 140A on the display region VA is patterned to form the touch-sensing electrode TE, which is used to sense touch positions or gestures of users. The periphery circuits 120 on the peripheral region PA is electrically connected to the touch-sensing electrode TE to transmit the sensing signal measured by the touch-sensing electrode TE to an external controller (not shown). In addition, there is no layer 130 and/or metal nanowires 140 on the bonding pad 170 of the periphery circuits 120, so that the bonding pads 170 may directly contact/connect the electrode pads (not shown) of the external circuit board 180. As a result, the circuit impedance of the touch panel in this embodiment is reduced so as to achieve improved electrical signal characteristics of the products. On the other hand, the touch-sensing electrode TE on the display region VA may have a thicker protection layer (i.e., the 130) than the conventional electrode structure, so that the properties of the touch panel in this embodiment can be improved, such as anti-oxidation, moisture resistance, acid/alkali resistance, and the like. Accordingly, the improved durability and product reliability may be obtained.

Figure 7:
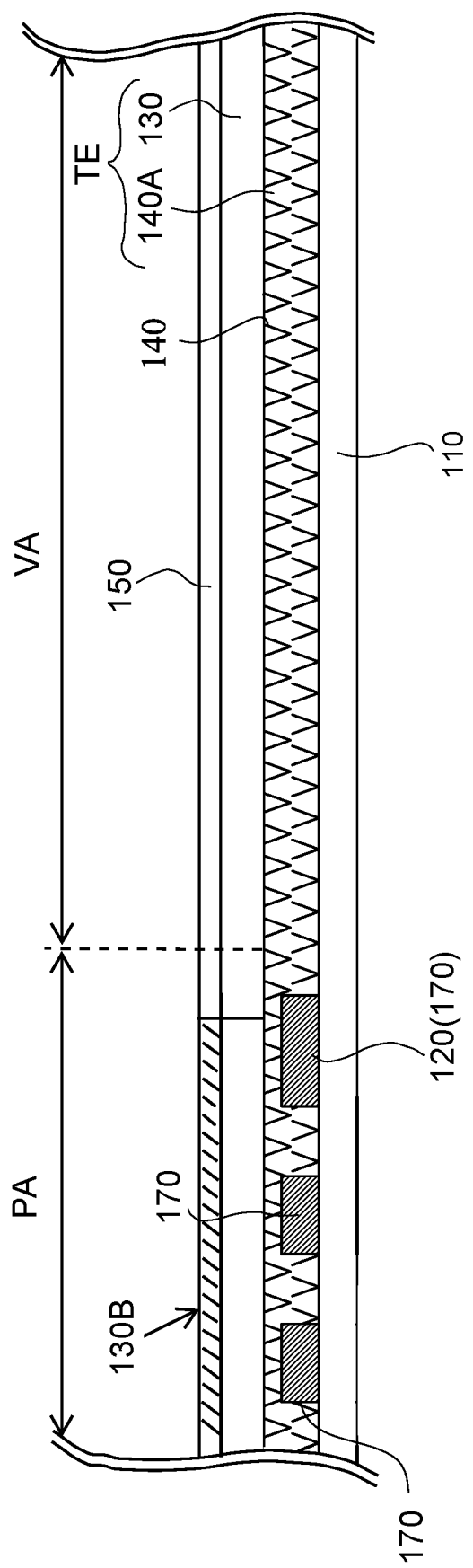
FIG. 7 is a schematic view of an alternative embodiment of the present disclosure.

In an alternative embodiment, in order to improve the photosensitivity of the layer 130 to further increase the precision (or resolution) of the patterning, a photosensitive layer 150 may be disposed on the pre-cured layer 130 after the above-mentioned step S2. The photosensitive material layer 150 may be a positive photosensitive material. FIG. 7 illustrates the cross-section A-A in FIG. 5 after the exposure step in step S3, which shows the structure of the positive photosensitive layer 150 and the layer 130. The method for forming the photosensitive layer 150 of this embodiment may include the following steps, but is not limited thereto. The positive photosensitive material is coated on the pre-cured layer 130 by a screen printing method, a spray coating method, a roll coating method, or similar coating processes, and then is cured by heating the photosensitive material to between about 80° C. and 120° C. to be a positive photosensitive layer 150. Then, a patterning step is performed by using the exposure energy of about 50 mj/cm$^2$ to about 1000 mj/cm$^2$ on the positive photosensitive layer 150/pre-cured layer 130 to define the removal area 130B and the reserved area 130A. Then, positive photosensitive layer 150/pre-cured layer 130 and the metal nanowires 140 on the removal region 130B are removed in a stripping step as described above. In an embodiment, a step of removing the entire photosensitive layer 150 may preferably be included after removing the pre-cured layer 130 and the metal nanowires 140 on the removal region 130B. Since positive photosensitivity materials with higher photosensitivity than the layer 130 are added in the present embodiment, the exposure energy used may be less than that of the previous embodiment. In addition, a pattern with thinner line width/distance or a high-resolution lithograph process may be formed by introducing the positive photosensitivity material layer 150. For example, the smallest feature (e.g., pitch), which can be printed with a specified depth of focus, of the layer 130 is equal to about 20 μm or higher than 20 μm, and the smallest feature, which can be printed with a specified depth of focus, of the positive photosensitive material layer 150 is about 10 μm or 5 μm. The layer 130 and/or the metal nanowires 140 may be patterned in a lithograph step having a smallest feature of 10 μm or 5 μm by patterning the positive-type photosensitive material layer 150, the layer 130 and/or the metal nanowires 140 at the same time. In one embodiment, the layer 130 is made of a material without photosensitivity, and the layer 130 and/or the metal nano-wire layer 140A are patterned while the exposed positive photosensitive material layer 150 is removed by a developer solution such as an alkaline solution (tetramethylammonium hydroxide (TMAH), Na$_2$CO$_3$, and the like). In addition, as discussed, the additive of ultraviolet stabilizers added to the layer 130 or metal nanowires 140 may make influence to the resolution/precision of the lithograph process. By adding the positive photosensitive material layer 150, the influence of the ultraviolet stabilizer added to the layer 130 may be reduced because the lithograph process is performed on the photosensitive layer 150. From the viewpoint of product characteristics, the added ultraviolet stabilizers may improve UV-resistance of products.

In one embodiment, while the patterned photosensitive layer 150 is stripped in a developing solution, the layer 130 and metal nanowires 140 under the stripped photosensitive layer 150 are simultaneously removed with the photosensitive layer 150. Preferably, the adhesive strength of the positive photosensitive material layer 150 to the structure having the pre-cured layer 130 and the metal nanowire layer 140A may be greater than that of the structure to the substrate 110 so that the underlying pre-cured layer 130 and the metal nanowire layer 140A are easily removed in the developing step.

Figure 8:
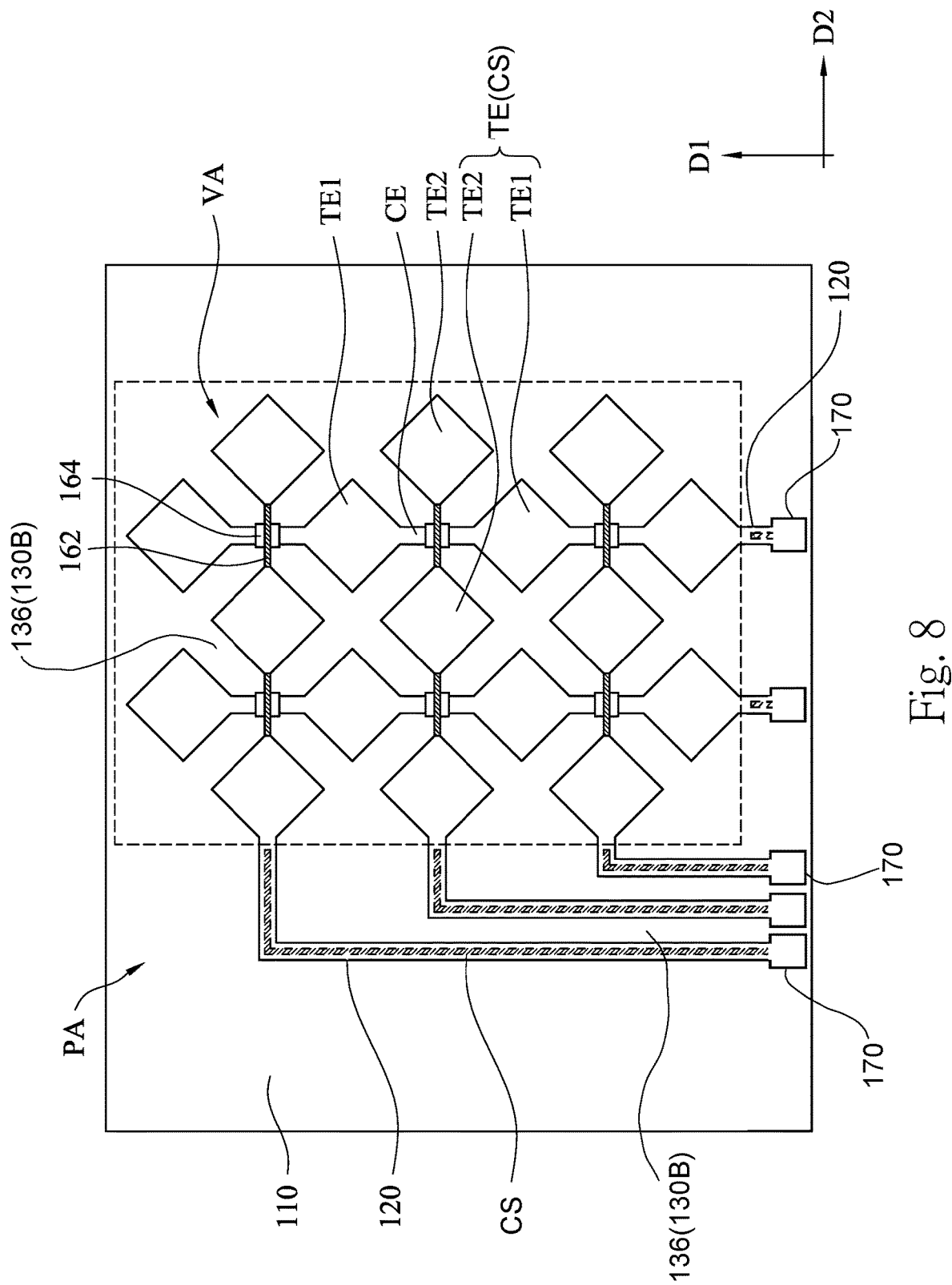
FIG. 8 is a top view of a touch panel in accordance with some embodiments of the present disclosure.

FIG. 8 shows another embodiment of the touch panel of the present disclosure, which is a touch panel with single-sided bridge-type electrodes. The transparent conductive layer (i.e., the composite structure CS of the layer 130 and the metal nanowires 140) formed on the substrate 110 is patterned as a touch-sensing electrode TE. In this embodiment, the touch-sensing electrode TE includes first touch-sensing electrodes TE1 arranged along a first direction D1, second touch-sensing electrodes TE2 arranged along a second direction D2, and a connection electrode CE, which electrically connects two adjacent first touch-sensing electrodes TEL In addition, bridge conductive wire 162 is formed above the corresponding connection electrode CE for connecting two adjacent second touch-sensing electrodes TE2. For preventing from the short circuit between the first touch-sensing electrodes TE1 and second touch-sensing electrodes TE2, the connection electrode CE and the bridge conductive wire 162 are electrically insulated from each other. In one embodiment, the cured layer 130 of connection electrode CE performs as insulator between the connection electrode CE and the bridge conductive wire 162. Since the layer 130 of the connection electrode CE has a sufficient thickness (for example, >40 nm), it can be used as an insulating material, and the bridge conductive wire 162 may be disposed directly on the layer 130 of the connection electrode CE to connect two adjacent second touch-sensing electrodes TE2 in the second direction D2. Alternatively, an auxiliary insulating block 164 may be disposed on the connection electrode CE. For example, a silicon dioxide material is formed on the connection electrode CE. Then, the bridge conductive wire 162, such as copper or gold materials is disposed on the insulating block 164. The bridge conductive wire 162 connects the two adjacent second touch-sensing electrodes TE2 in the second direction D2. The insulating block 164 is formed between the connection electrode CE and the bridge conductive wire 162 to electrically isolate the connection electrode CE and the bridge conductive wire 162, so that the touch-sensing electrodes TE in the first direction D1 and the second direction D2 are electrically isolated from each other. It should be noted that, considering the insulation that may be caused by the layer 130 of the second touch-sensing electrode TE2, via holes (not shown) may preferably be formed in the layers 130 of the second touch-sensing electrodes TE2. Two ends of the bridge conductive wire 162 are connected to the metal nanowires 140 of the adjacent second touch-sensing electrodes TE2 through the via holes. Accordingly, two adjacent second touch-sensing electrodes TE2 are connected by the bridge conductive wire 162 with reduced electric resistance.

In addition, in the embodiment shown in FIG. 8, the composite structure CS formed by the layer 130 and the metal nanowires 140 may be disposed on the peripheral region PA to cover the periphery circuits 120 and expose the bonding pads 170. Specific implementation can refer to the previous description, which will not be repeated here.

In addition to the above-mentioned single-sided touch panel, the process of the present disclosure may also be applied to a double-sided touch panel. The method includes the following steps, but not limited thereto. The periphery circuits 120 are fabricated on the opposite sides (such as the top and bottom surfaces) of the substrate 110 respectively. Then the metal nanowire layer 140A and the layer 130 are formed on opposite sides of the substrate 110 by the above-mentioned methods. Next, double-sided exposure, developing or similar processes are used to form the patterned touch-sensing electrodes TE on both opposite sides of the substrate 110, and the patterned touch-sensing electrodes TE on both opposite sides correspond to the display region VA. As in the above-mentioned embodiments, the bonding pads 170 of the peripheral circuits 120 are exposed from the layer 130 and metal nanowires 140, so that the bonding pads 170 may directly contact/connect the electrode pad of the circuit board 180. As a result, the circuit impedance of the touch panel in this embodiment is reduced. On the other hand, the thickness of the layer 130 of the touch-sensing electrode TE on the display region VA may be thicker than the conventional structure, so as to provide the metal nanowires 140 with improved protection, such as anti-oxidation, moisture resistance, acid/alkali resistance, and the like.

In an embodiment, in order to avoid interference on the opposite sides of the substrate 110 during exposure process, light sources having different exposure timings may be used in the exposure process. In another embodiment, light sources with different wavelengths may be used in the exposure process. For example, G-line and I-line sources are used to define the patterns on opposite sides of the substrate 110 respectively. In addition, the layers 130 on the opposite sides of the substrate 110 have different photosensitivity. In another embodiment, a beam-blocking layer (not shown) may be formed on the opposite sides of the substrate 110 in advance, and then the periphery circuits 120 and the metal nanowire layer 140A may be formed on the beam-blocking layer. Specifically, the beam-blocking layer is a UV blocking layer, and the layers 130 on the opposite sides of the substrate 110 may be made of the polymers having equal photosensitivity. Accordingly, an exposure process is performed by using the same UV light source to pattern the layers 130 on the opposite sides of the substrate 110. The UV blocking layer may absorb a portion of the UV light with specific wavelengths (e.g., at least 10%, 20%, 25%, or 20%-50% of the total energy), while substantially allowing the transmission of light with visible wavelengths (e.g., 400-700 nm), for example, greater than 85% of the total energy of visible light. In one embodiment, the UV blocking layer is polyethylene terephthalate (PET) film with a thickness of 50 μm, which is a commercial product "HB3-50" from Teijin DuPont Films. Another exemplary UV blocking layer is polyethylene terephthalate (PET) film with a thickness of 125 μm, which is a commercial product "XST6758" from Teijin DuPont.

FIG. 9 shows the touch panel in the embodiment of the present disclosure assembled with other electronic devices. For example, the touch panel of the present disclosure is assembled with a display panel to form a display device having touch function. The substrate 110, peripheral circuits 120 (including the bonding pad 170) and the touch-sensing electrodes TE formed by the metal nano-wire layer 140 and the layer 130 can refer to the previous description, which will not be repeated here. On the other hand, the lower surface of the substrate 110 may be attached to a display element 100, such as a liquid crystal display element, and the substrate 110 and the display element 100 may be bonded together using an optically clear adhesive (OCA) AD. Similarly, the touch-sensing electrode TE may also be attached to the cover glass CG (or called protective glass) by the optically clear adhesive AD. Preferably, the optically clear adhesive AD may fill in the non-conductive region 136 between the adjacent touch-sensing electrodes TE to achieve an improved assembling strength Like the foregoing embodiments, there is no layer 130 and metal nanowires 140 formed on the bonding pads 170 of the periphery circuits 120, so that the bonding pad 170 may directly contact/connect the external circuit board 180. Therefore, the circuit impedance of the touch panel in this embodiment is reduced, and the SN ratio of the touch-sensing signals is improved.

In some embodiments of the present disclosure, while patterning (i.e., exposure and/or developing steps in a lithograph process) the layer 130, the transparent conductive layer having the metal nanowire layer 140A and the layer 130 is patterned at the same time to form the touch-sensing electrodes TE on the display region. Therefore, the etching step that requires an etchant solution conventionally to pattern the metal nanowire layer 140A may be omitted, so that the problems caused by the residue of the etchant solution may be solved, and the effect of improving the production yield may be achieved.

In some embodiments of the present disclosure, the metal nanowire layer 140A does not need to be patterned by using an etchant solution, so that the influence of the etchant solution to the elements of the touch-sensing panel (for example, the periphery circuits 120 made of a metal material or other metallic elements) may be eliminated.

In some embodiments of the present disclosure, because of the photosensitivity of the polymer layer and/or the photosensitive layer, the polymer layer and/or the photosensitive layer is patterned by a developer solution after the photochemical reaction in an exposure step. Simultaneously, the metal nanowires embedded in or combined with the polymer layer are also removed by the developer solution so as to pattern the electrode layer. Accordingly, the conventional etching step to pattern the metal nanowire layer 140A may be omitted, and the processes of forming the devices are simplified and the manufacturing costs are reduced.

In some embodiments of the present disclosure, by completely removing the layer 130 and the metal nanowires 140 on the bonding pad 170, the bonding pad 170 is exposed form layer 130 and the metal nanowires 140 to directly contact the external circuit board 180, so that a low impedance conductive path may be formed. As a result, the losses and distortions of the transmission of touch signals are reduced.

In some embodiments of the present disclosure, since the bonding pad 170 is exposed form layer 130 and the metal nanowires 140, the influence caused by the layer 130 and the metal nanowires 140 to the contact resistance between the bonding pad 170 and the external circuit board 180 may be omitted. Thus, the thickness of the layer 130 on the touch-sensing electrode in the display region may be increased (for example, greater than 200 nm) as requested. The thick layer 130 may function as a protective layer, which provides the product for improved durability. For example, the anti-oxidation ability, moisture resistance, or acid/alkali resistance of the products are improved.

In some embodiments of the present disclosure, by increasing the thickness of the layer 130 or adding a photosensitive layer on the touch-sensing electrodes, the durability of the touch-sensing electrodes on the display area may be improved.

In some embodiments of the present disclosure, the process described above may produce a single-sided or double-sided touch panel in a continuous production with numbers of batches.

Although the present disclosure is disclosed by the preceding embodiments, the present disclosure is not limited. Those skilled in the art should realize that such equivalent constructions do not depart from the spirit and scope of the present disclosure, and that they may make various alterations and modification herein without departing from the spirit and scope of the present disclosure. Therefore, the scope of the disclosure shall be defined by the following claims.

What is claimed is:

1. A direct patterning method for a touch panel, the direct patterning method comprising:
providing a substrate having a display region and a peripheral region;
forming a periphery circuit on the peripheral region, wherein the periphery circuit comprises a bonding pad, and the periphery circuit comprises a single layer of silver or a single layer of copper or multilayer materials comprising molybdenum and aluminum;
disposing a metal nanowire layer on the display region and the peripheral region, wherein the metal nanowire layer comprises a plurality of metal nanowires and is stacked on the bonding pad, and the metal nanowire layer is formed directly on the substrate on the display region, and the metal nanowire layer is formed on the substrate and covers the periphery circuit on the peripheral region;
pre-curing a coated layer to form a pre-cured layer on the metal nanowire layer, wherein the pre-cured layer is photosensitive;
performing a photolithography process, comprising:
exposing the pre-cured layer to define a removal area and a reserved area; and
removing the pre-cured layer and the metal nanowire layer on the removal area using a developer solution to form touch-sensing electrodes disposed on the display region and to expose the bonding pad disposed on the peripheral region, wherein the touch-sensing electrodes are electrically connected to the periphery circuit, and the touch-sensing electrodes include the pre-cured layer and the metal nanowire layer; and
curing the pre-cured layer.

2. The method as claimed in claim 1, further comprising completely removing the metal nanowire layer on the removal area in a second removal step.

3. The method as claimed in claim 2, wherein the second removal step comprises using an organic solution or an alkaline solution in combination with a mechanical procedure to completely remove the metal nanowire layer on the removal area.

4. The method as claimed in claim 2, wherein the second removal step comprises an adhesive removal method to completely remove the metal nanowire layer on the removal area.

5. The method as claimed in claim 1, wherein after disposing the pre-cured layer on the metal nanowire layer, the method further comprises disposing a positive photosensitive layer on the pre-cured layer, and wherein
the performing the photolithography process comprises:
exposing the positive photosensitive layer and the pre-cured layer to define the removal area and the reserved area; and
removing the positive photosensitive layer, the pre-cured layer and the metal nanowire layer on the removal area using the developer solution.

6. The method as claimed in claim 5, wherein a photosensitivity of the positive photosensitive layer is higher than a photosensitivity of the pre-cured layer.

7. The method as claimed in claim 5, further comprising removing the positive photosensitive layer.

8. The method as claimed in claim 1, wherein a location of the removal area corresponds to a location of the bonding pad, and wherein the removing the pre-cured layer and the metal nanowire layer on the removal area comprises removing the pre-cured layer and the metal nanowire layer on the bonding pad.

9. The method as claimed in claim 1, wherein the removing the pre-cured layer and the metal nanowire layer on the removal area comprises forming a non-conductive region between adjacent touch-sensing electrodes of the touch-sensing electrodes.

10. The method as claimed in claim 1, wherein the non-conductive region is a gap, or the non-conductive region includes the metal nanowire layer having a concentration lower than a percolation threshold.

11. A touch panel, comprising:
a substrate, wherein the substrate has a display region and a peripheral region;
a polymer layer and a metal nanowire layer disposed on the substrate; and
a periphery circuit disposed on the peripheral region, wherein the periphery circuit comprises a bonding pad comprising a single layer of silver or a single layer of copper or multilayer materials comprising molybdenum and aluminum;
wherein the metal nanowire layer is formed directly on the substrate on the display region, and the metal nanowire layer is formed on the substrate and covers the periphery circuit on the peripheral region;
wherein the polymer layer is defined to form a removal area and a reserved area after exposing the polymer layer;
wherein touch-sensing electrodes on the display region are formed by removing the polymer layer and the metal nanowire layer on the removal area using a developer solution;
wherein the bonding pad is exposed from the polymer layer and the metal nanowire layer, only part of the bonding pad is covered by the metal nanowire layer;
wherein the touch-sensing electrode is electrically connected to the peripheral region.

12. The touch panel as claimed in claim 11, wherein the metal nanowire layer comprises a plurality of metal nanowires, the metal nanowires are embedded in the polymer layer on the reserved area to form a conductive network, and the polymer layer and the metal nanowire layer on the display region integrally form the touch-sensing electrodes.

13. The touch panel as claimed in claim 11, wherein the polymer layer is photosensitive.

14. The touch panel as claimed in claim 11, wherein the polymer layer has a thickness of about 200 nm to about 400 nm.

15. The touch panel as claimed in claim 11, wherein the metal nanowire layer and the periphery circuit form a connection structure at a boundary between the display region and the peripheral region.

16. The touch panel as claimed in claim 11, wherein the touch-sensing electrodes extend to the peripheral region and cover the periphery circuit, and the touch-sensing electrodes do not cover the bonding pad.

17. The touch panel as claimed in claim 11, further comprising a non-conductive region between adjacent touch-sensing electrodes of the touch-sensing electrodes.

18. The method as claimed in claim 17, wherein the non-conductive region is a gap, or the non-conductive region includes the metal nanowires having a concentration lower than a percolation threshold.

* * * * *